(12) United States Patent
Moldsvor et al.

(10) Patent No.: US 8,970,409 B2
(45) Date of Patent: Mar. 3, 2015

(54) DYNAMIC DITHERING METHOD AND APPARATUS FOR ANALOG-TO-DIGITAL CONVERTERS

(71) Applicant: Hittite Microwave Corporation, Chelmsford, MA (US)

(72) Inventors: Oystein Moldsvor, Tiller (NO); Bjornar Hernes, Trodheim (NO)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/800,797

(22) Filed: Mar. 13, 2013

(65) Prior Publication Data
US 2014/0091957 A1  Apr. 3, 2014

Related U.S. Application Data

(60) Provisional application No. 61/614,180, filed on Mar. 22, 2012.

(51) Int. Cl.
*H03M 1/20*  (2006.01)
*H03M 1/06*  (2006.01)
*H03M 1/12*  (2006.01)

(52) U.S. Cl.
CPC .......... *H03M 1/0639* (2013.01); *H03M 1/0641* (2013.01); *H03M 1/12* (2013.01)
USPC ............ 341/131; 341/155; 341/161; 341/162

(58) Field of Classification Search
CPC ... H03M 1/06; H03M 1/0639; H03M 1/0641; H03M 1/0695
USPC .......................................... 341/131, 161–162
See application file for complete search history.

(56) References Cited

U.S. PATENT DOCUMENTS

| 5,187,481 | A | 2/1993 | Hiller | |
|---|---|---|---|---|
| 7,221,299 | B2 | 5/2007 | Bjornsen | |
| 7,719,452 | B2* | 5/2010 | Bardsley et al. | 341/131 |
| 7,830,287 | B1* | 11/2010 | Huang | 341/131 |
| 8,497,790 | B1* | 7/2013 | Lewis et al. | 341/120 |
| 8,604,953 | B2* | 12/2013 | Ali | 341/120 |
| 2005/0275578 | A1 | 12/2005 | Bjornsen | |

FOREIGN PATENT DOCUMENTS

EP  1 248 376  10/2002

OTHER PUBLICATIONS

International Search Report and Written Opinion of Aug. 23, 2013 for International Application No. PCT/IB2013/001198 filed Mar. 15, 2013. 10 pages.

* cited by examiner

*Primary Examiner* — Khai M Nguyen
(74) *Attorney, Agent, or Firm* — Knobbe, Martens, Olson & Bear, LLP

(57) ABSTRACT

A dynamic dithering method is provided for improving linearity in analog-to-digital converters.

26 Claims, 5 Drawing Sheets

DYNAMIC DITHERING METHOD AND APPARATUS FOR ANALOG-TO-DIGITAL CONVERTERS

CROSS REFERENCE TO RELATED APPLICATION

This application claims priority from U.S. Provisional Patent Application No. 61/614,180 filed on Mar. 22, 2012 entitled DYNAMIC DITHERING METHOD AND APPARATUS, which is hereby incorporated by reference.

BACKGROUND

The linearity or Spurious-Free Dynamic Range (SFDR) of analog-to-digital converters (ADCs) has been steadily improving as a result of increasing demands from various applications and communication infrastructure. Several techniques have been developed to improve the linearity of ADCs. However, they have limitations that restrict their use.

Analog to digital conversion of signals involves two different operations. The first operation, called sampling, converts an input signal from a time continuous signal to a time discrete signal. The second operation, called quantization, converts the sampled signal into a finite number of values. Nonlinearities in an ADC can arise in both the sampling and quantization operations. The Sampler used for sampling, particularly the input stage of the Sampler, can introduce nonlinearities. Non-uniform distribution of the quantization levels of the Quantizer used for quantization can also introduce nonlinearities.

Good linearity can be achieved by proper design methodologies and circuit optimization. However, at a certain level, a limit is reached due to weaknesses in process technologies or due to random mismatches. In addition, the power dissipation may be unacceptably high using a straightforward approach. Therefore, different methods have been implemented to improve linearity without the above drawbacks. Two common methods are calibration and dithering.

Nonlinearities in the Quantizer are generated if the quantization levels are not evenly distributed in the entire signal range of the Quantizer. The non-uniform distribution of quantization levels is often due to effects like mismatch, incomplete transient settling, low amplifier gain, and signal dependent gain in amplifiers. Calibration algorithms can be used where the quantization steps are measured, and errors can be corrected either in the analog or digital domain.

With dithering, a small random voltage, called dither signal, is added to or multiplied with the input signal before it is propagated through the signal chain. The dither signal, which typically is spectrally white, mixes with the input signal and error terms, transforming the spurious components into spectrally white noise contributions. Dithering can improve SFDR both due to nonlinearities in the Sampler and the Quantizer. However, it can improve performance only for circuitry behind the point in the signal chain where the dither is applied.

Both calibration and dithering are widely used in the industry both at the component level and the system level. There are however significant challenges with both methods.

With respect to calibration, measuring an error before correcting for it is required for all types of calibration. This must be done with extremely high accuracy. In an ADC, the SFDR typically will be around 20 dB better than the signal-to-noise ratio (SNR). In order to improve the SFDR beyond this value, the errors must be measured with significantly better accuracy than the SNR requirement plus 20 dB. On the other hand, if one could use dither and convert a tone 20 dB below SNR to white noise, the SNR would not be significantly affected. Hence, a significant challenge of calibration is to be able to measure or estimate the errors with sufficient accuracy.

In practice, calibration schemes will add significant complexity to the design. Designing the calibration circuitry and system can prove more difficult and time consuming than designing the ADC itself.

In addition, temperature and supply voltage variations require periodic recalibration. Many of the calibration schemes require that the ADC is disconnected from the signal path during the calibration procedure. This will introduce an interruption in the operation of the ADC that is undesirable in many applications.

Conventionally used dithering techniques also have limitations. A dither signal will has the same properties as noise, and will add to the noise power in the signal, reducing the SNR. It is therefore common to use techniques to digitally subtract the dither signal from the digital output of the ADC. This can be done only with certain accuracy, and a reduction in SNR due to "leakage" of dither noise into the signal is common.

Another problem with dithering is that the total power (or amplitude) converted by the ADC is increased by the amplitude of the dither signal. To avoid saturation of the ADC, the input signal amplitude therefore has to be reduced by the same amount as the dither signal amplitude. However, reducing the input signal amplitude is equivalent to reducing the SNR of the ADC since the noise power is kept constant. The dither signal is most efficient when the amplitude of the dither signal is relatively large compared with the signal. This introduces a tradeoff between improvement in SFDR and reduction in SNR due to the dither signal.

BRIEF SUMMARY

In accordance with one or more embodiments, an analog-to-digital conversion circuit is provided, comprising a sample-and-hold amplifier (SHA) for sampling an analog input signal, adding a dither signal to the sampled analog input signal, and producing an analog SHA output signal; and an analog-to-digital converter (ADC) coupled to the SHA for converting the analog SHA output signal to a digital ADC output signal; wherein the SHA includes a circuit for adjusting the dither signal such that the analog SHA output signal does not exceed an input voltage range of the ADC.

A method of converting an analog input signal to a digital signal in accordance with one or more embodiments comprises the steps of: (a) sampling the analog input signal; (b) providing a dither signal; (c) adjusting the dither signal; (d) adding the dither signal to the sampled analog input signal and producing an analog output signal; and (e) converting the analog output signal to a digital output signal using an analog-to-digital converter (ADC); wherein the dither signal is adjusted in step (c) such that the analog output signal does not exceed an input voltage range of the ADC.

DETAILED DESCRIPTION

The techniques described herein in accordance with various embodiments can be applied to generally any ADC and SHA architecture.

Figure 1:
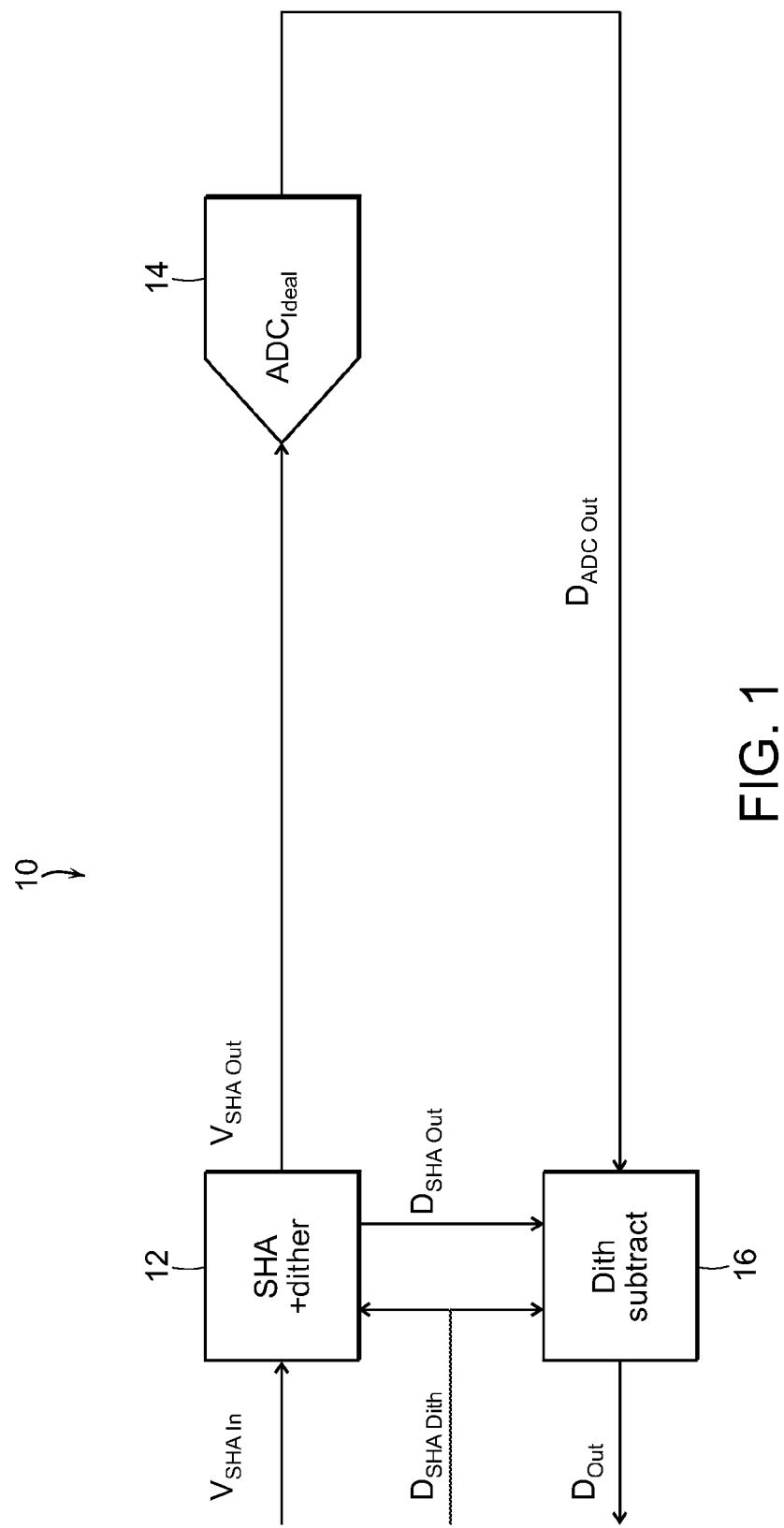
FIG. 1 is a functional diagram of an analog-to-digital converter employing a Sample-and-Hold Amplifier (SHA) with dither addition in accordance with one or more embodiments.

FIG. 1 is a functional diagram of an analog-to-digital converter circuit 10 employing an SHA 12 with dither addition in accordance with one or more embodiments. The circuit 10 also includes an ADC 14 and Dith-subtract block 16. The dither can be applied in the SHA 12 in front of the ADC 14 as shown in the figure.

Figure 2:
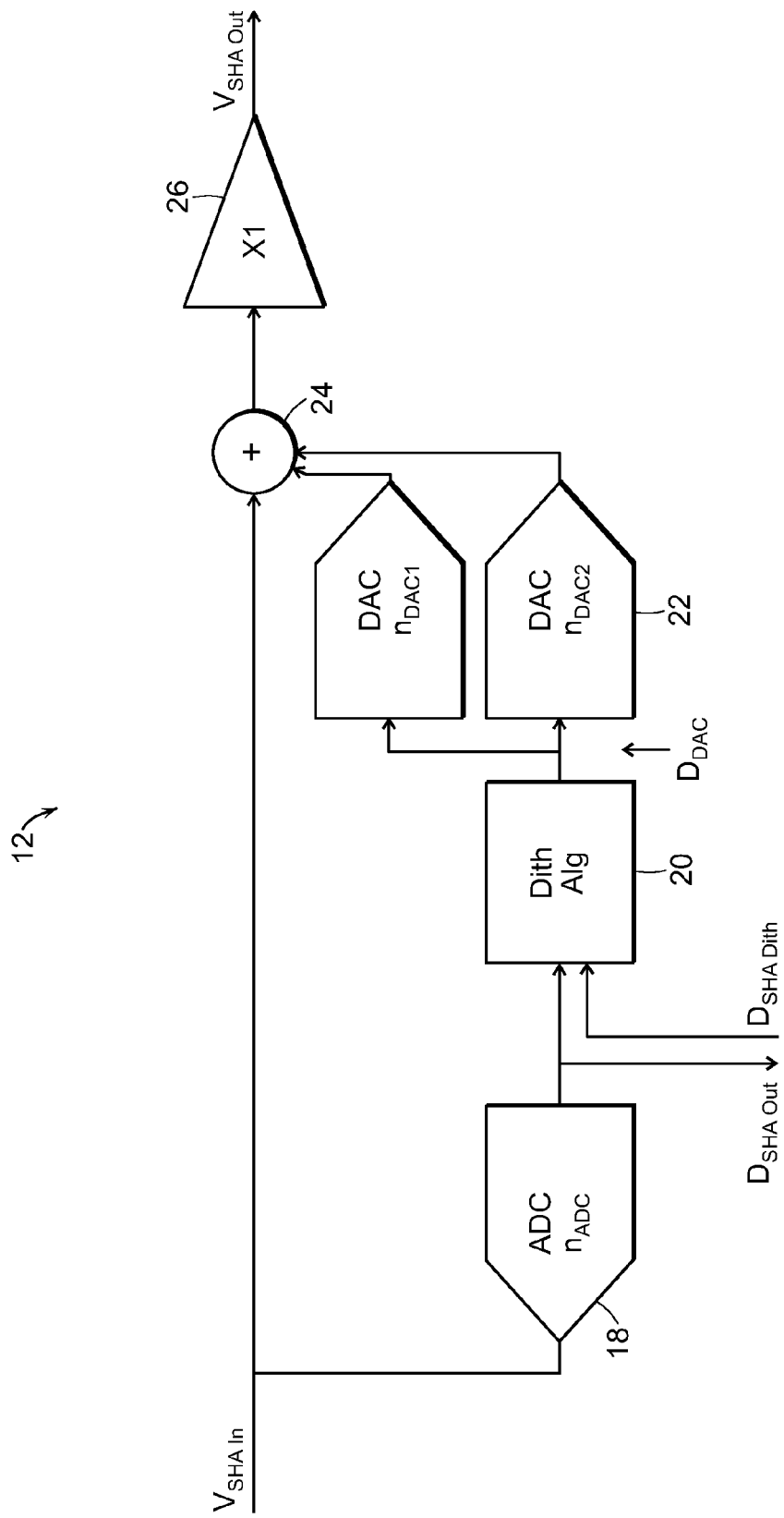
FIG. 2 is a functional diagram of an SHA with dither addition in accordance with one or more embodiments.

The SHA 12 is shown in further detail in FIG. 2. It should be understood that the actual implementation may differ from the simplified drawing. The SHA 12 includes a sub-ADC 18, Dith-Alg block 20, one or more DACs 22 (two DACs 22 are shown in the FIG. 2 embodiment), a summing element 24, and an amplifier 26, each of which is an integrated part of the SHA 12.

The input analog signal, $V_{SHA\ In}$, is applied to the SHA 12, which samples the signal and adds the dither signal before the result, $V_{SHA\ Out}$, is presented at the output. The SHA output signal is connected to the ADC input. The ADC 14 converts the sampled signal to digital format, $D_{ADC\ Out}$. The dither is subtracted from the digital signal by the "Dith-subtract" block 16 generating the digital output, $D_{out}$.

In accordance with various embodiments, the Dith-Alg block 20 formats the applied dither signal such that the SHA output never exceeds the ADC input voltage range. In this way, the dither signal can have a high amplitude without requiring a reduced input signal amplitude. This makes it possible to optimize the amplitude of the dither signal without trading off the SNR and SFDR.

The sub-ADC 18 measures which segment the input signal is in. The Dith-Alg block 20 takes the value of the sub-ADC output and adjusts the properties of the dither according to the value of the input signal. The dither signal is adjusted such that it always has a negative maximum value when the input signal is close to the positive maximum input voltage, and a positive value when the input signal is close to the negative maximum input voltage. This ensures that the output signal of the SHA 12 never exceeds the input range of the ADC 14. The accuracy of the sub-ADC does not need to be high. However, the decision error should not be so high that the input signal plus dither signal is higher than the ADC input range.

Figure 3:
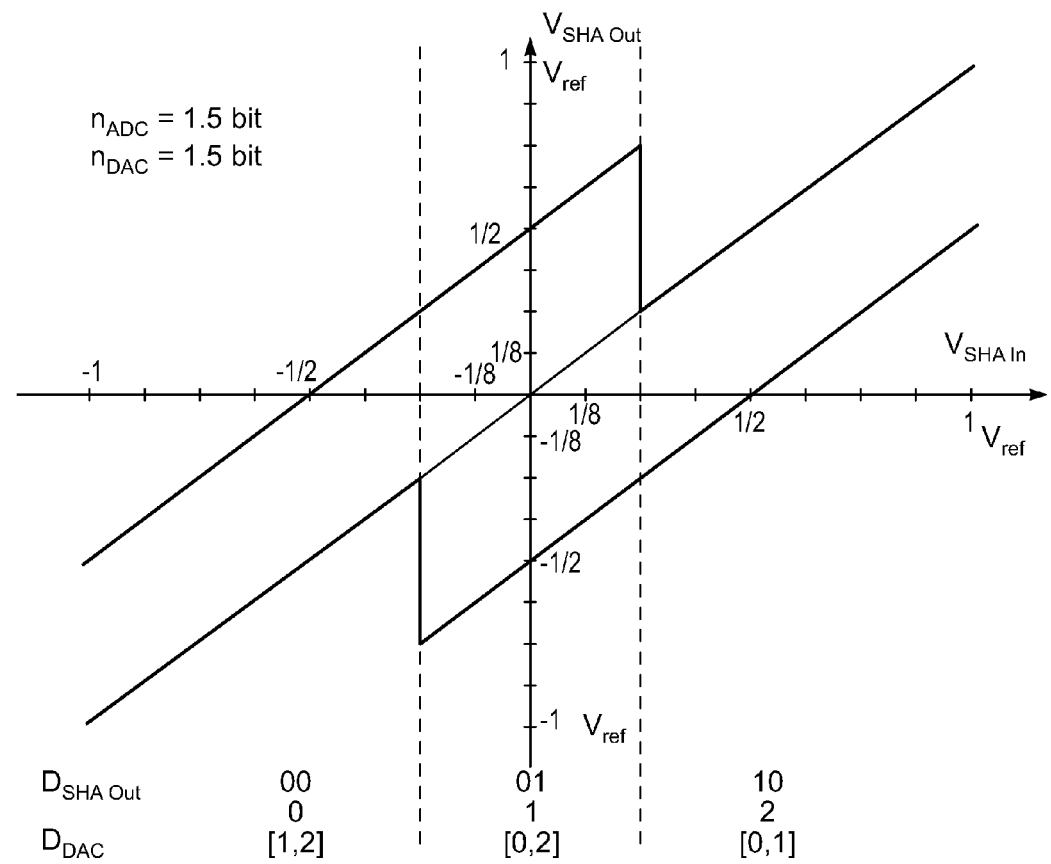
FIG. 3 shows an exemplary SHA transfer function with a sub-ADC of 1.5 bits and a 1.5 bit dither digital-to-analog converter (DAC) in accordance with one or more embodiments.

FIG. 3 shows an exemplary implementation where the sub-ADC and the dither DAC both have 1.5 bits of resolution (2 quantization levels).

The transfer characteristic of the SHA should be a straight line with 1 WV slope. This line is shown as the center line in FIG. 3. The $D_{SHA\ Dith}$ signal is a signal with some random properties. Most commonly, it will be a pseudo random bit sequence with a white frequency spectrum. For the following explanation it is assumed that $D_{SHA\ Dith}$ is a single pseudo random bit. The DAC output will be in multiples of a DAC reference voltage VREF.

The output from the sub-ADC, $D_{SHA\ Dout}$, will have value 00 in the left segment of FIG. 3, 01 in the middle segment, and 10 in the right segment. In case $D_{SHA\ Dout}$ is 01, the DAC will either output +1 VREF if $D_{SHA\ Dith}$ is high or −1 VREF if $D_{SHA\ Dith}$ is low. The SHA output will therefore in this segment randomly be one VREF above or below the straight line transfer curve of the SHA. This will efficiently dither the output signal of the SHA and provide a dithered signal to the ADC.

In the upper and lower segments corresponding to $D_{SHA\ Dout}$ equal to 00 and 10, the DAC behavior is altered. For $D_{SHA\ Dout}$ equal to 00, the DAC will output +1 VREF if $D_{SHA\ Dith}$ is high or zero if $D_{SHA\ Dith}$ is low. For $D_{SHA\ Dout}$ equal to 10, the DAC will output zero if $D_{SHA\ Dith}$ is high or −1 VREF if $D_{SHA\ Dith}$ is low. The resulting SHA output waveform will then either follow the straight line transfer curve of the SHA or it will be one VREF closer to zero volt output. The resulting waveform is shown by the bold curves in FIG. 3.

The SHA output signal will due to the Dith-Alg function be dithered by the pseudo random dither sequence $D_{SHA\ Dith}$, and the dithered output signal amplitude will not exceed the maximum amplitude given by the straight-line transfer function of the SHA without dither.

Various alternative implementations of the methods described herein are possible. The number of bits in the sub-ADC can be different from 1.5. Any number of bits higher than one (1) is possible. However, when the number of bits is increased, the practical implementation becomes more difficult.

It is possible to have more than one DAC to add the dither. It would be desirable to have different properties of the dither signal in the different segments of the sub-ADC. The following alternatives may be advantageous for different implementations or for some special conditions:

The dither signal may have a higher amplitude in the two end segments than in the middle segment. This is equivalent to enabling different DACs for the different segments and each of them having different $V_{REF}$.

The number of DAC bits may be different in the different segments.

The transition levels for the sub-ADC may not be evenly spaced across the input range of the ADC.

An Exemplary Implementation

Figure 4:
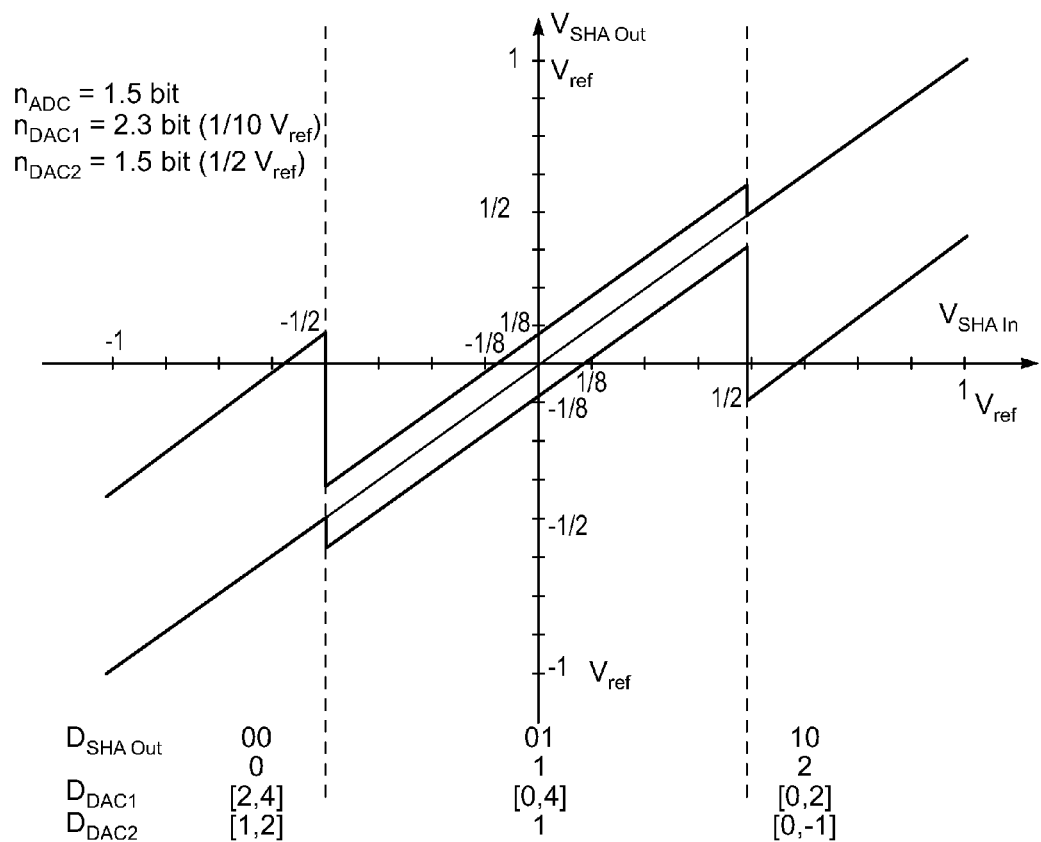
FIG. 4 shows an exemplary transfer function of an alternative configuration of an SHA with dither addition in accordance with one or more embodiments.

A typical implementation is shown in FIG. 4. The sub-ADC has 1.5 bits. In this example there are two DACs as shown in FIG. 2. One has 1.5 bit in the left and right segments (0 and +/−VREF) and is switched off in the middle segment. The second DAC has and 2.3 bits (5 levels) for the complete range. However, in the left segment (sub-ADC 00), only codes resulting in zero or positive output voltages are used, and in the right segment (sub-ADC), only codes resulting in zero or negative voltages are used. The result is that the dither in these two segments always brings the output signal of the SHA to a lower amplitude, and the succeeding ADC will not be overdriven due to the dither signal.

Figure 5:
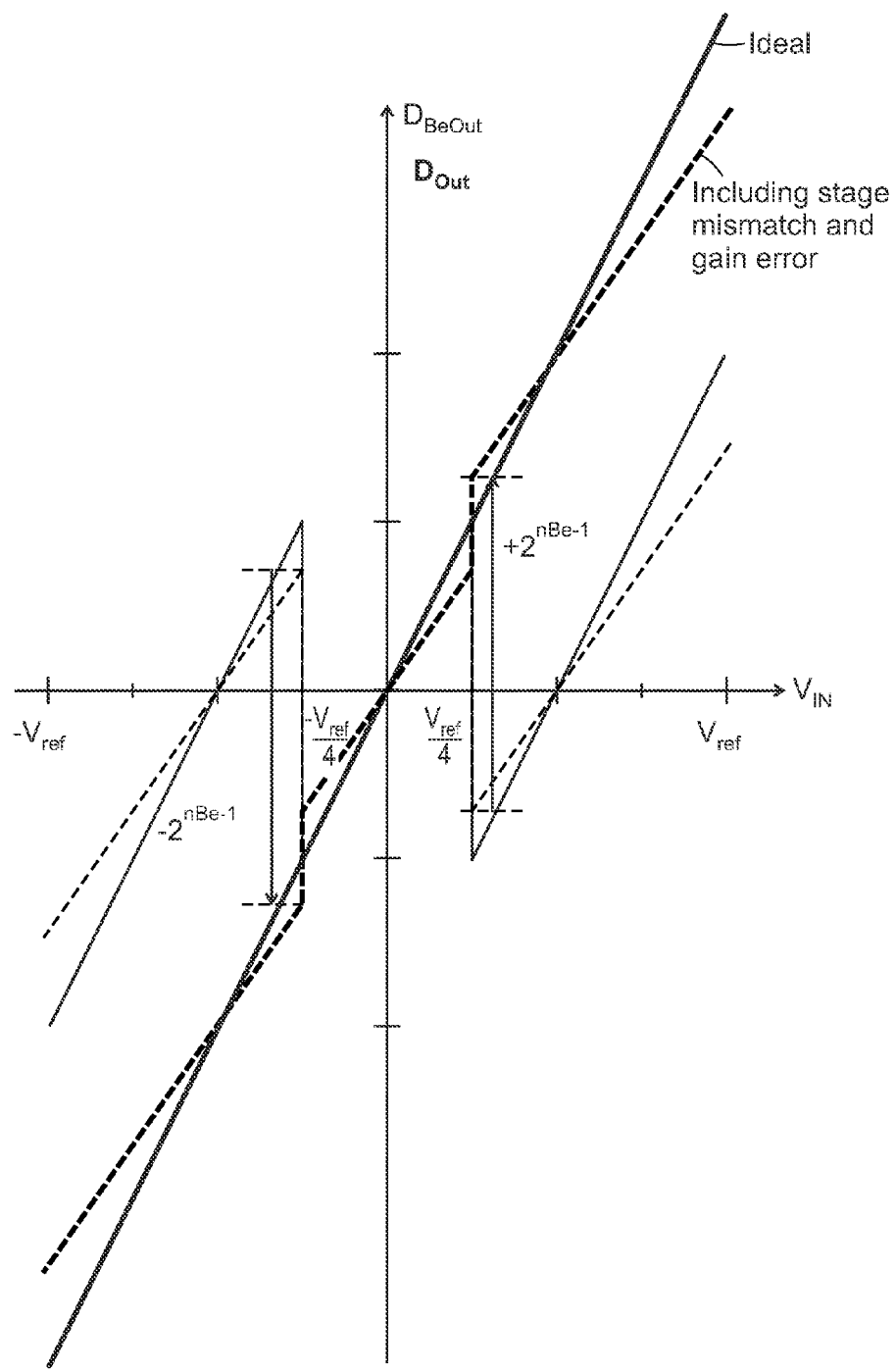
FIG. 5 shows an exemplary transfer function of a typical 1.5 bit/stage pipelined ADC stage in accordance with one or more embodiments.

The VREF is typically much smaller for the DAC in the middle segment since nonlinearities in this segment are dominated by discontinuities in the ADC transfer function. The actual value of VREF is very important when used with some ADC architectures. FIG. 5 shows a graph of the transfer function of a 1.5 bit/stage pipeline stage.

The output of the pipeline stage is shown as the fine solid line. At −Vref/4 and +Vref/4, a reference voltage is added and subtracted respectively from the output signal. In the digital correction logic of the ADC, a digital representation of the reference voltages are subtracted and added in the left and right segments, respectively, to generate the solid straight line for ideal conditions. However, in the presence of gain errors, the correction is not ideal and discontinuities in the curve will result as shown in the thick dashed line. Such a transfer function would result in harmonic distortion. The same would apply for other stages in the pipeline generating similar discontinuities for multiple locations across the input range, and always at locations relative to Vref/2^n.

Assume that dither is used to avoid generating harmonic distortion due to this discontinuity, and assume that there is a small signal centered around Vref/4. Then assume that the dither DAC uses a reference voltage equal to Vref/2. The dither would then move the input signal from around +Vref/4 to −Vref/4 in a random fashion. However, the output voltage from the stage is equal at these two locations, and the dither would not be visible for the succeeding stage. In addition, the discontinuity in the transfer function for the first stage is more or less equal at the two points depending on what error mechanism is dominating. The result is that the dither will not effectively randomize the error and harmonic distortion will occur even with dither applied.

It is therefore important to select a VREF for the dither DAC that is not a fraction of the ADC reference voltage in such a way that the dither DAC output voltage becomes equal to the reference transition step in some of the pipelined ADC stages.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and drawings are by way of example only, and are not intended to be limiting.

What is claimed is:

1. An analog-to-digital conversion circuit, comprising:
a sample-and-hold amplifier (SHA) configured to sample an analog input signal, add a dither signal to the sampled analog input signal, and produce an analog SHA output signal; and
an analog-to-digital converter (ADC) coupled to the SHA, the ADC configured to convert the analog SHA output signal to a digital ADC output signal;
wherein the SHA includes an adjustment circuit configured to adjust at least a polarity of the dither signal based on the sampled analog input signal such that the analog SHA output signal does not exceed an input voltage range of the ADC.

2. The analog-to-digital conversion circuit of claim 1, further comprising a dither subtract circuit coupled to the ADC, the dither subtract circuit configured to receive the digital ADC output signal and subtract the dither signal from the digital ADC output signal to produce a digital output signal.

3. The analog-to-digital conversion circuit of claim 1, wherein the adjustment circuit is configured to adjust the dither signal such that the adjusted dither signal has a negative value when the analog input signal is above a given voltage and the adjusted dither signal has a positive value when the analog input signal is below a given voltage.

4. The analog-to-digital conversion circuit of claim 1, wherein the adjustment circuit is configured to adjust a magnitude of the dither signal.

5. The analog-to-digital conversion circuit of claim 1, wherein the SHA comprises a sub-ADC configured to convert the analog input signal to a digital sub-ADC output signal and to provide the digital sub-ADC output signal to the adjustment circuit.

6. An analog-to-digital conversion circuit, comprising:
a sample-and-hold amplifier (SHA) configured to sample an analog input signal, add a dither signal to the sampled analog input signal, and produce an analog SHA output signal; and
an analog-to-digital converter (ADC) coupled to the SHA, the ADC configured to convert the analog SHA output signal to a digital ADC output signal;
wherein the SHA comprises a circuit configured to adjust the dither signal such that the analog SHA output signal does not exceed an input voltage range of the ADC, and
wherein the SHA further comprises a sub-ADC configured to convert the analog input signal to a digital sub-ADC output signal by sampling the analog input signal, said digital sub-ADC output signal provided to the circuit configured to adjust the dither signal.

7. The analog-to-digital conversion circuit of claim 6, further comprising a digital-to-analog converter coupled to the circuit configured to adjust the dither signal, said digital-to-analog converter configured to convert the output of the circuit configured to adjust the dither signal into an analog output signal.

8. The analog-to-digital conversion circuit of claim 7, further comprising an analog summing circuit configured to add the analog output signal from the digital-to-analog converter to the analog input signal.

9. The analog-to-digital conversion circuit of claim 8, further comprising an amplifier configured to amplify an output of the summing circuit to produce the analog SHA output signal.

10. The analog-to-digital conversion circuit of claim 8, further comprising a second digital-to-analog converter coupled to the circuit configured to adjust the dither signal, the second digital-to-analog converter configured to convert the output of the circuit configured to adjust the dither signal into a second analog output signal and to provide the second analog output signal to the analog summing circuit.

11. The analog-to-digital conversion circuit of claim 6, wherein the sub-ADC and the digital-to-analog converter have an arbitrary number of quantization steps.

12. The analog-to-digital conversion circuit of claim 6, wherein the circuit configured to adjust the dither signal is configured to adjust the dither signal based on the digital sub-ADC output signal.

13. The analog-to-digital conversion circuit of claim 6, wherein the circuit configured to adjust the dither signal is configured to adjust a polarity and a magnitude of the dither signal.

14. The analog-to-digital conversion circuit of claim 6, further comprising a dither subtract circuit coupled to the ADC, the dither subtract circuit configured to receive the digital ADC output signal and subtract the dither signal from the digital ADC output signal to produce a digital output signal.

15. A method of converting an analog input signal to a digital signal, the method comprising:
sampling the analog input signal, said sampling comprising converting the analog input signal to a digital sub-ADC output signal;
providing a dither signal;
adjusting the dither signal based on the digital sub-ADC output signal;

adding the dither signal to the sampled analog input signal and producing an analog output signal; and converting the analog output signal to a digital output signal using an analog-to-digital converter (ADC);

wherein said adjusting comprises adjusting the dither signal such that the analog output signal does not exceed an input voltage range of the ADC.

16. The method of claim 15, further comprising subtracting the dither signal from the digital output signal from the ADC.

17. The method of claim 15, further comprising converting the result of the step of adding the dither signal to the sampled analog input signal to an analog signal.

18. The method of claim 17, further comprising adding the analog signal to the analog input signal using a summing circuit.

19. The method of claim 18, further comprising amplifying an output of the summing circuit to produce the analog output signal.

20. The method of claim 15, wherein said adjusting comprises adjusting the dither signal such that the adjusted dither signal has a negative value when the analog input signal is above a given voltage, and the adjusted dither signal has a positive value when the analog input signal is below a given voltage.

21. The method of claim 15, wherein said adjusting comprises adjusting a polarity and a magnitude of the dither signal.

22. An analog-to-digital conversion circuit, comprising:

a sample-and-hold amplifier (SHA) configured to sample an analog input signal and produce an analog SHA output signal based on a dither signal and the sampled analog input signal;

an analog-to-digital converter (ADC) configured to convert the analog SHA output signal to a digital ADC output signal; and a dither subtract circuit configured to receive the digital ADC output signal and subtract the dither signal from the digital ADC output signal to produce a digital output signal.

23. The analog-to-digital conversion circuit of claim 22, wherein the SHA is configured to adjust a polarity and a magnitude of the dither signal to produce an adjusted dither signal and to produce the SHA output signal based on the adjusted dither signal.

24. The analog-to-digital conversion circuit of claim 22, wherein the SHA comprises a sub-ADC configured to convert the analog input signal to a digital sub-ADC output signal, wherein the SHA is configured to adjust the dither signal based on the digital sub-ADC output to produce the SHA output signal based on adjusted dither signal.

25. The analog-to-digital conversion circuit of claim 24, wherein the SHA is configured to adjust the dither signal to produce an adjusted dither signal, and wherein the SHA further comprises:

a first digital-to-analog converter configured to receive the adjusted dither signal and convert the adjusted dither signal into a first analog signal;

a second digital-to-analog converter configured to receive the adjusted dither signal and convert the adjusted dither signal into a second analog signal; and an analog summing circuit configured to add the analog input signal, the first analog signal, the second analog signal.

26. The analog-to-digital conversion circuit of claim 22, wherein the SHA is configured to adjust the dither signal such that the analog SHA output signal stays within an input voltage range of the ADC.

* * * * *